United States Patent [19]

Mirle et al.

[11] Patent Number: 5,268,257
[45] Date of Patent: Dec. 7, 1993

[54] AQUEOUS DEVELOPABLE, PHOTOCURABLE COMPOSITION, AND FLEXIBLE, PHOTOSENSITIVE ARTICLES MADE THEREFROM

[75] Inventors: Srinivas K. Mirle; Arthur L. Berrier, both of Ellicott City, Md.

[73] Assignee: W. R. Grace & Co.-Conn., New York, N.Y.

[21] Appl. No.: 28,715

[22] Filed: Mar. 9, 1993

Related U.S. Application Data

[63] Continuation of Ser. No. 561,849, Aug. 1, 1990, abandoned.

[51] Int. Cl.$^5$ .............................................. G03C 1/76
[52] U.S. Cl. ................................... 430/285; 430/286; 430/287; 430/288; 430/302; 522/107
[58] Field of Search ............... 430/281, 285, 286, 287, 430/288, 306, 302; 522/107

[56] References Cited

U.S. PATENT DOCUMENTS

| | | | |
|---|---|---|---|
| 3,546,184 | 12/1970 | Heidel et al. | 260/78.4 |
| 3,766,215 | 10/1973 | Hesse et al. | 260/346.8 |
| 3,974,129 | 8/1976 | De La Mare | 204/159.24 |
| 4,023,973 | 5/1977 | Imaizumi et al. | 96/115 R |
| 4,038,084 | 7/1977 | Nakano et al. | 96/115 P |
| 4,045,231 | 8/1977 | Toda et al. | 96/115 P |
| 4,162,240 | 7/1979 | Hino et al. | 260/29.7 B |
| 4,192,684 | 3/1980 | Gensho et al. | 430/284 |
| 4,275,142 | 6/1981 | Hosaka et al. | 430/271 |
| 4,399,211 | 8/1983 | Kondo et al. | 430/269 |
| 4,442,302 | 4/1984 | Pohl | 204/159.23 |
| 4,722,947 | 2/1988 | Thanawalla et al. | 522/120 |
| 4,762,892 | 8/1988 | Koch et al. | 525/279 |
| 4,857,434 | 8/1989 | Klinger | 430/286 |
| 4,916,045 | 4/1990 | Koch et al. | 430/270 |
| 5,102,773 | 4/1992 | Littmann et al. | 430/285 X |

FOREIGN PATENT DOCUMENTS

| | | |
|---|---|---|
| 50-73944 | 6/1975 | Japan . |
| 51-37128 | 3/1976 | Japan . |
| 52-81396 | 7/1977 | Japan . |
| 54-129044 | 10/1979 | Japan . |
| 5723693 | 5/1987 | Japan . |
| 1598894 | 9/1981 | United Kingdom . |

OTHER PUBLICATIONS

Calvin F. Schildknecht, *Vinyl and Related Polymers: Their Preparations, Properties, and Applications in Rubbers, Plastics, Fibers and in Medical and Industrial Arts*, John Wiley & Sons, Inc., New York, N.Y., 1952, pp. 244-249.

Primary Examiner—Jack P. Brammer
Attorney, Agent, or Firm—Valerie E. Looper

[57] ABSTRACT

A photocurable composition $P(Y)(Y_1)(Y_2)$ is prepared by reacting a solid carboxylated copolymer $P(Y)$ having at least one pendent carboxyl group Y, and optionally one or more terminal carboxyl groups Y, with (i) a photosensitive vinyl-containing compound, e.g. glycidyl (meth)acrylate, which produces $Y_1$ and optionally, with (ii) an anhydride, e.g. maleic anhydride, to produce $Y_2$. $Y_1$ has free vinyl groups and $Y_2$ has free vinyl and acid groups. In addition, $P(Y)$ can be a liquid carboxylated copolymer which is chain extended in order to prepare a solid. Either of the resulting photocurable compositions can be used "as is" or can be formulated with vinyl containing monomers and photoinitiators to prepare solid, flexible photosensitive articles, e.g. flexographic printing plates, which are water dispersible, and yet possess acceptable mechanical properties for flexographic printing.

23 Claims, No Drawings

AQUEOUS DEVELOPABLE, PHOTOCURABLE COMPOSITION, AND FLEXIBLE, PHOTOSENSITIVE ARTICLES MADE THEREFROM

This is a continuation of application Ser. No. 561,849, filed Aug. 1, 1990, now abandoned.

FIELD OF THE INVENTION

This invention relates to radiation curable prepolymers and formulations or compositions containing the same, as well as photosensitive articles having solid surfaces or layers prepared from such prepolymers or formulations. The invention also relates to a process for making and using the prepolymer or composition to form the photosensitive articles.

BACKGROUND OF THE INVENTION

Photocurable prepolymers and compositions are well known in the art for forming printing plates and other photosensitive or radiation sensitive articles. In the field of radiation sensitive flexographic printing plates, the plates typically comprise a support and a photosensitive surface or layer from a photocurable composition. Additional layers or surfaces on the plate include slip and release films to protect the photosensitive surface. Prior to processing the plate, the additional layers are removed, and the photosensitive surface is exposed to radiation in an imagewise fashion. The unexposed areas of the surface are then removed in developer baths.

Removal of unexposed surfaces comprising solid photocurable compositions such as those disclosed in U.S. Pat. No. 2,760,863 require the use of developer baths comprising environmentally unsafe, organic solvents such as tetrachloroethylene, 2-butanone, benzene, toluene, xylene, trichloroethane and solvent mixtures such as tetrachloroethylene/n-butanol. However, due to the toxicity, high volatility and low flash point, their use gives rise to hazardous conditions and creates pollution problems. Thus, recently there has been a strong interest in the field to develop photosensitive layers in non-organic solvent developing solutions, e.g. aqueous, surfactant-aqueous or alkaline-aqueous solutions. However, the compositions resulting from recent attempts to achieve aqueous developable plates demonstrate deficiencies in mechanical properties, e.g. flexibility. See European Application 261,910.

For instance, in addition to possessing an aqueous developable photosensitive surface, a flexographic printing plate must have sufficient flexibility to wrap around a printing cylinder, yet be strong enough to withstand the rigors experienced during typical printing processes. Further, the printing plate should possess a low hardness or softness to facilitate ink transfer during printing.

Previous aqueous developable compositions have not possessed all the desirable features such as flexibility, softness and solvent resistance to inks typically used in printing. For example, U.S. Pat. No. 4,023,973 describes a photosensitive composition comprising a maleic anhydride adduct of a 1,2-polybutadiene. However, because the 1,2 content of this material is very high, i.e. 70% or more, this composition has an undesirably high rubber hardness.

Furthermore, other water-developable photosensitive compositions which contain as the main component a high molecular weight polymer such as polyvinyl alcohol, cellulose, polyethylene oxide, or the like, are insufficient in flexibility and possess a high degree of rubber hardness and hence are unsuitable for use in flexographic printing plates.

Finally, it is also important that the photosensitive surface of the printing plate be dimensionally stable during storage. For example, some compositions used for making plates have shown inferior stability properties when used in solid flexographic printing plates in that the compositions become tacky and pasty during storage. Those inferior properties have been attributed to the low molecular weight of the polymers used to prepare the printing plates. See U.S. Pat. No. 4,762,892 to Koch et al. and discussion of low molecular weight polymers disclosed in Japanese Kokoku 57-23693.

SUMMARY OF THE INVENTION

Accordingly, it is an object of the invention to prepare a photocurable composition which is suitable as an aqueous developable, storage stable, photosensitive solid surface or layer on a flexible photosensitive article such as a flexible printing plate.

It is an object of the invention to provide a photosensitive article comprising the novel photocurable composition.

It is also an object of the invention to prepare a novel photopolymerizable composition wherein the composition comprises a polymer having the structure:

wherein P is a copolymer of (i) an elastomeric monomer and (ii) a hydrophilic monomer, Y represents at least one pendent carboxyl group and possibly one or more terminal carboxyl groups, $Y_1$ is a photosensitive vinyl group-containing terminal or pendent group, preferably having a structure

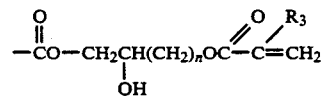

and $Y_2$ is a photosensitive vinyl and acid containing terminal or pendent group, preferably having a structure

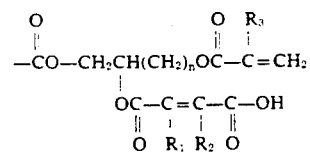

wherein $Y_2$ is optional, $R_1$ and $R_2$ are individually a member of the group consisting of hydrogen, halogen, carboxyl, linear or cyclic alkyl containing 1–20 carbon atoms, aryl, alkaryl and aralkyl containing 6–20 carbon atoms; $R_3$ is a hydrogen or methyl; and n is 1 to 6.

It is a further object to develop a novel process for preparing photopolymerizable compositions, the process comprising (a) reacting a carboxylated copolymer having at least one pendent carboxyl group and possibly one or more terminal carboxyl group with a reagent having (1) a photosensitive vinyl group and (2) an acid reactive group attached thereto and (b) optionally, reacting the product from (a) with an anhydride of the formula

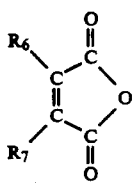

wherein $R_6$ and $R_7$ are individually a member of the group consisting of hydrogen, halogen, carboxyl, linear or cyclic alkyl containing 1-20 carbons atoms, aryl, alkaryl and aralkyl containing 6 to 20 carbon atoms.

DETAILED DESCRIPTION

The precursor to the photocurable composition is a copolymer having the structure (P)(Y). The precursor copolymer is a carboxylated copolymer prepared from an elastomeric monomer and a hydrophilic monomer. The elastomeric component provides flexibility to the copolymer and articles in which they are used. Suitable examples include, but are not limited to, butadiene, isoprene, and acrylonitrile-butadiene. The hydrophilic component provides water dispersability. Suitable examples include (meth)acrylic acid or any other acid containing monomer that can be copolymerized with the elastomeric component. The resulting polymer has at least one pendent and possibly one or more terminal carboxyl groups Y on the backbone P.

The copolymers used herein are prepared according to well known polymerization techniques such as emulsion polymerization. The resulting copolymers can be in either solid or liquid form. Suitable solid copolymers include those having a Mooney viscosity of at least about 20 and no more than about 60, and most preferably in the range of 20 to 30. The acid content of the solid copolymers (and the liquid copolymers described below) is relatively high when compared to other commercially available polymers and is preferably 0.1–0.5 ephr. The term "ephr" refers to equivalents of functional groups in 100 grams of the resin polymer P. As indicated above, the acid content includes at least one carboxyl group which is pendent to the polymer backbone and may contain one or more terminal acid groups as well.

Suitable liquid copolymers of the components mentioned above have a weight average molecular weight in the range of 5,000 to 30,000 and viscosities typically greater than 12,000,000 centipoise (cp) at 27° C. An example of a suitable liquid copolymer is butadiene-methacrylic acid having a molecular weight of 10,000 and a viscosity of greater than 2,000,000 cp.

In the event that a liquid copolymer is used as the precursor, it is necessary to chain extend the copolymer until it becomes a solid. Otherwise, any photocurable composition resulting therefrom will result in a cured solid printing plate having insufficient mechanical properties. Chain extension is carried out by any difunctional chain extender which can react with the copolymer's backbone acid groups. Preferable chain extenders are diepoxides such as 1,2,7,8 - octane diepoxide. Commercially available diepoxide compounds include the diglycidyl ethers from Henkel; Epon ® 871 and Epon 872 epoxies from Shell Oil; and DER ® 736 and DER 732 epoxies from Dow.

Chain extension is carried out in a molar ratio of acid reactive group, e.g. epoxide, to carboxyl group so that 15 to 40% of the copolymer's carboxyl groups are reacted. With the liquid polymer described above, the chain extension reaction is preferably carried out so that about 25% of the free carboxyl groups are reacted because at this point the compound usually solidifies. However, the amount of chain extension required to prepare a solid composition depends on the carboxyl content and molecular weight of the starting polymer P (Y).

To enhance the carboxylated copolymer's photocurability, the precursor is modified to contain terminal and pendent $Y^1$ groups. The $Y^1$ groups are created by reacting a photosensitive vinyl group-containing compound with either the solid carboxylated copolymer or the liquid carboxylated copolymer which has been chain extended to a solid copolymer (hereinafter collectively referred to as "carboxylated copolymers" unless referred to specifically). The vinyl-containing compound has an acid reactive functional group as well, e.g. an epoxy group. Suitable vinyl-containing compounds are (meth)acrylate compounds such as

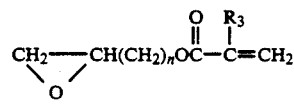

wherein n is an integer from 1 to 6 and $R_3$ is methyl or hydrogen. A preferred (meth)acrylate containing compound is glycidyl methacrylate (GMA). The reaction between the acid groups of the carboxylated copolymer and the acid reactive group on the vinyl-containing compound results in a pendent or terminal structure having a free photosensitive vinyl group. In the instance GMA is used, the resulting terminal or pendent group $Y_1$ has the structure:

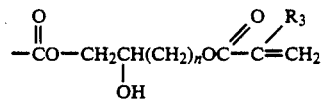

wherein n = 1 and $R_3$ is methyl.

If P(Y) is a solid copolymer, the vinyl-containing compound is added in an amount sufficient to react (through the acid reactive group on the vinyl-containing compound) with at least about 1% of the free carboxyl groups on P and preferably about 1 to 10%. Described another way, after the vinyl-containing compound has been reacted with the solid copolymer, there will preferably be at least 0.001 ephr $Y_1$ groups and most preferably about 0.001–0.05 ephr.

If P(Y) is a liquid copolymer which has been chain extended to a solid copolymer, the vinyl-containing compound should be added in an amount sufficient to preferably react with at least about 5% of the free carboxyl groups and most preferably about 5 to 30%. Described another way, after the chain extended liquid copolymers have been reacted with a vinyl-containing compound, there will preferably be at least 0.005 ephr $Y_1$ groups and most preferably about 0.005–0.150 ephr.

By using polymers with higher acid content, the reactions described above can be easily used to prepare a photocurable composition which is water dispersible. In other words, there are not only enough carboxyl groups on the polymer's backbone to attach the photosensitive vinyl groups, but there are enough carboxyl groups remaining after that reaction to impart at least partial water dispersibility.

The reaction between the vinyl-containing compound and P(Y) depends on the acid reactive group on the vinyl containing compound. As illustrated by the reaction of P(Y) with GMA, the reaction can be run for 3 to 50, and preferably 25 to 40 hours between 25° C. and 200 ® C.. with a preferred temperature of about 100° C. Instances where a solid copolymer P(Y) is used, the reaction times tend to be somewhat longer than when liquid copolymers are used. A suitable solvent for the reaction is chlorobenzene, although other solvents and solvent mixtures can be used. Catalysts may also be used to reduce the required reaction temperature and time. Suitable catalysts include sodium hydroxide, sodium ethoxide, triethylbenzyl ammonium chloride, hydrogen chloride, boron trifluoride and tertiary amines such as trimethylamine or benzyldimethylamine. A preferred catalyst is 1,8-diazabicyclo [5.4.0] undec7-ene. Generally, about 0.1-2% by weight catalyst can be used, with about 0.5% by weight being preferred.

Subsequent to reacting the vinyl-containing compound with the carboxylated copolymer, the water dispersibility of the photocurable composition can be enhanced by reacting the composition with an anhydride of the formula

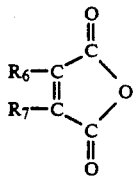

wherein $R_6$ and $R_7$ are individually a member of the group consisting of hydrogen, halogen, carboxyl, linear or cyclic alkyl containing 1-20 carbon atoms, aryl, alkaryl and aralkyl containing 6 to 20 carbon atoms. Maleation of the photocurable composition is desirable when there is a need to increase the water dispersibility of the composition and there are anhydride reactive groups produced as a result of the reaction with the vinyl-containing compound. The dispersibility of the compound is increased by maleation because of the creation of additional carboxyl groups. When solid carboxylated copolymers are used, maleation is not usually needed. See Examples 3 and 4. On the other hand, when starting with a chain extended carboxylated copolymer, maleation is usually necessary because the chain extension can consume an amount in the range from 0.015 to 0.200 ephr of the polymer's carboxyl groups. Accordingly, the additional carboxyl groups which result from the maleation reaction would be desirable in order to prepare a photocurable composition having sufficient water dispersibility. However, it is envisioned that liquid carboxylated copolymers with very high acid content could be used so that maleation would not be needed.

If a solid carboxylated copolymer is used, preferably all of the $Y_1$ groups will be maleated, i.e. the maleic anhydride is added in stoichiometric amount to the hydroxyl groups on the Y groups. However, it is not necessary to completely maleate all of the $Y_1$ groups and there will be instances where unmaleated $Y_1$ groups will remain.

If a chain extended copolymer is used, not only can substantially all of the Y groups be maleated, but any anhydride reactive groups which are created by the chain extension reaction can also be reacted, e.g. anhydride-reactive hydroxyl groups created by the reaction of the diepoxide chain extenders with the carboxyl groups on the copolymer. Thus, both sources of anhydride reactive groups should be accounted for when determining the amount of maleic anhydride to be added. As with the solid copolymer, it is not necessary to maleate all of the $Y_1$ groups, or any other anhydride reactive groups, on the chain extended liquid copolymers and thus $Y_1$ groups can remain on those copolymers after maleation.

When the photocurable composition has been reacted with a (meth)acrylate, the above maleation reaction creates a side chain on $Y_1$ to transform structure $Y_1$ into a pendent or terminal group $Y_2$ having the structure:

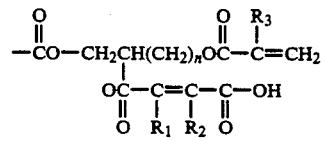

wherein $R_1$ and $R_2$ are individually a member of the group consisting of hydrogen, halogen, carboxyl, linear or cyclic alkyl containing 1-20 carbon atoms, aryl, alkaryl and aralkyl containing 6 to 20 carbon atoms; $R_3$ is hydrogen or methyl; and n is 1 to 6. The maleation reaction is carried out at a temperature in the range 60°-120° C. for periods ranging from 4-12 hours. The reaction is preferably carried out in the presence of a thermal inhibitor, such as di-t-butyl cresol, and in inert solvents such as a toluene, benzene, chloroform, methylene chloride, tetrahydrofuran, acetone and ethyl acetate. Although no catalysts are necessary, catalytic amounts of acids or Lewis acids such as phosphoric acid and stannous octoate can be employed.

As illustrated by the preferred embodiment for $Y_2$, the pendent or terminal group $Y_2$ has two significant characteristics. $Y_2$ has a free photosensitive vinyl group which serves as a photopolymerizable group. Second, maleation of the hydroxyl group on $Y_1$ provides carboxylic acid groups on $Y_2$, thereby creating a pendent or terminal group having improved dispersability in aqueous media, e.g. aqueous developing baths used to remove unexposed areas of photocurable composition after a photopolymerization process.

A copolymer which has been processed as above can be solvent cast, as is, to create a solid photopolymerizable layer on photosensitive articles. However, it is preferable to formulate the photopolymerizable composition with, in the range of about 1 to 20% by weight, reactive monomer, and most preferably in the range of 5 to 15% by weight reactive monomer. Suitable reactive monomers are those of the formula:

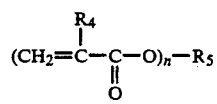

wherein $R_4$ is hydrogen or methyl, and $R_5$ is an organic moiety having the valence of n, and n is 1 or more. Such reactive acrylic diluents include, but are not limited to, trimethylolpropane triacrylate, hexanediol diacrylate, 1,3-butylene glycol diacrylate, diethylene glycol diacrylate, 1,6-hexanediol diacrylate, neopentyl glycol diacrylate, polyethylene glycol 200 diacrylate, tetraethylene glycol diacrylate, triethylene glycol diacrylate, pentaerythritol tetraacrylate, tripropylene glycol diacrylate, ethyloxylated bisphenol-A diacrylate, trimethylolpropane diacrylate, ditrimethylolpropane tetraacrylate, triacrylate of tris(hydroxyethyl) isocyanurate, dipentaerythritol hydroxypentaacrylate, pentaerythritol triacrylate, ethoxylated trimethlyolpropane triacrylate, triethylene glycol dimethacrylate, ethylene glycol dimethacrylate, tetraethylene glycol dimethacrylate, polyethylene glycol-200 dimethacrylate, 1,6-hexanediol dimethacrylate, neopentyl glycol dimethacrylate, polyethylene glycol-600 dimethacrylate, 1,3-butylene glycol dimethacrylate, ethoxylated bisphenol-A dimethacrylate, trimethylolpropane trimethacrylate, diethylene glycol dimethacrylate, 1,4-butanediol diacrylate, diethylene glycol dimethacrylate, pentaerythritol tetramethacrylate, glycerin dimethacrylate, trimethylolpropane dimethacrylate, pentaerythritol trimethacrylate, pentaerythritol dimethacrylate, pentaerythritol diacrylate and the like which can be added to the photopolymerizable composition to modify the cured product. Monoacrylates such as cyclohexyl acrylate, isobornyl acrylate, lauryl acrylate and tetrahydrofurfuryl acrylate and the corresponding methacrylates are also operable as reactive diluents.

Photoinitiators for the photopolymerizable composition and formulations containing the same include the benzoin alkyl ethers, such as benzoin methyl ether, benzoin ethyl ether, benzoin isopropyl ether and benzoin isobutyl ether. Another class of photoinitiators are the dialkoxyacetophenones exemplified by 2,2-dimethoxy-2-phenylacetophenone, i.e. Irgacure ®651 (Ciba-Geigy) and 2,2-diethoxy-2-phenylacetophenone. Still another class of photoinitiators are the aldehyde and ketone carbonyl compounds having at least one aromatic nucleus attached directly to the carboxyl group. These photoinitiators include, but are not limited to benzophenone, acteophenone, o-methoxybenzophenone, acenaphthenequinone, methyl ethyl ketone, valerophenone, hexanophenone, alpha-phenyl-butyrophenone, p-morpholinopropiophenone, dibenzosuberone, 4-morpholinobenzophenone, 4'-morpholinodeoxybezoin, p-diacetylbenzene, 4-aminobenzophenone, 4'-methoxyacetophenone, benzaldehyde, alpha-tetralone, 9-acetylphenanthrene, 2-acetylphenanthrene, 10-thioxanthenone, 3-acetylphenanthrene, 3-acetylindone, 9-fluorenone, 1-indanone, 1,3,5-triacetylbenzene, thioxanthen-9-one, xanthene-9-one, 7-H-benz[de]anthracen-7-one, 1-naphthaldehyde, 4,4'-bis(dimethylamino)-benzophenone, fluorene-9-one, 1'-acetonaphthone, 2'-acetonaphthone, 2,3-butanedione, acetonaphthene, benz[a]anthracene 7.12 diene, etc. Phosphines such as triphenylphosphine and tri-o-tolylphosphine are also operable herein as photoinitiators. The photoinitiators or mixtures thereof are usually added in an amount ranging from 0.01 to 5% by weight of the total composition.

Other additives to the photocurable composition can be included. To inhibit premature crosslinking during storage of the prepolymer containing compositions of this invention, thermal polymerization inhibitors and stabilizers are added. Such stabilizers are well known in the art, and include, but are not limited to, hydroquinone monobenzyl ether, methyl hydroquinone, amyl quinone, amyloxyhydroquinone, n-butylphenol, phenol, hydroquinone monopropyl ether, phenothiazine and nitrobenzene, and mixtures thereof. Such additives are used in an amount within the range of from about 0.01 to about 2% by weight of the prepolymer. These stabilizers are effective in preventing crosslinking of the prepolymer composition during preparation, processing and storage.

The compositions also may contain up to about 50% by weight of an inert particulate filler which is essentially transparent to actinic light. Such fillers include the organophilic silicas, bentonites, silica and powdered glass. Such fillers can impart desirable properties to the photocurable compositions and reliefs on printing plates containing those compositions.

The photocurable composition can then be shaped and formed as a solid layer of suitable thickness according to conventional solvent casting, i.e., dissolving the composition in a solvent, shaping the solution into a film or plate and removing the solvent. Conventional extrusion calendaring or hot press techniques can also be used. Solid layers of the photosensitive composition in the form of a film can be adhered to supports such as those comprising polyester, nylon or polycarbonate. Other suitable supports include woven fabrics and mats, e.g. glass fiber fabrics or laminated materials made of for example, glass fibers and plastics. It is preferred that the supports are dimensionally stable and resistant to the washout solutions.

It is also usually necessary to protect photosensitive surfaces from contamination by dirt and dust during storage before being exposed and washed. Such protection is accomplished by lamination or application of a flexible protective cover sheet to the side of the photocurable composition opposite that of the support. In addition, the photocurable compositions can sometimes be tacky and it is thus also desirable to apply a release film to the surface of the photosensitive layer before application of the coversheet. The release film may consist of a thin, flexible and water dispersible polymeric film and allows for intimate contact between the surface of the photocurable composition opposite to the support and an image bearing negative applied to the surface.

Photosensitive articles comprising a support having a solid layer or surface comprising the photocurable composition, e.g. solid flexographic printing plates, can then be processed by well known techniques for imagewise exposure to actinic light. Preferably, the light should have a wavelength of from about 230–450 mm. Exposure is through a negative placed between the light source and the photosensitive surface. Suitable sources of light include Type RS sunlamps, carbon arc lamps, xenon arc lamps, mercury vapor lamps, tungsten halide lamps and the like.

Exposure periods depend upon the intensity of the actinic light, thickness of the plate and the depth of the relief desired on the printing plate. Periods of from 2 to 20 minute exposures are preferred.

After exposure and the negative has been removed, the unexposed areas of the photosensitive surface can be developed in aqueous solutions. Suitable solutions include those of nonionic and cationic surfactants, as well as basic and semi-aqueous basic solutions and combinations thereof. Such surfactants are commercially available as Triton ®X-100 (non-ionic) and Triton RW-150 (cationic) from Rohm & Haas Company.

EXAMPLE 1

Chain Extended Liquid Copolymer 60 g of butadiene-methacrylic acid copolymer having a molecular weight of about 10,000 and a viscosity greater than 2 million cp was dissolved in approximately 300 g chlorobenzene in a 500 ml resin kettle fitted with an overhead stirrer, a thermometer and a heating mantle connected to a temperature regulator. The reaction mixture was heated to 60° C. and 0.9 g Geltrol (anti-gelation agent) from B. F. Goodrich, 9 drops nitrobenzene (Lewis acid scavenger) and 0.9 g decane (internal standard for GLC) were added. On subsequent heating to 120° C., a chlorobenzene solution of 2.37 g 1,2,7,8-octane diepoxide and 0.9 g 1,8-diazabicyclo[5.4.0]undec-7-ene was added. As determined by gas-liquid chromatography (GLC), 95% of the diepoxide had reacted in 5 hours of heating at 120° C. After reducing the temperature to 90° C., 1.8 g of glycidyl methacrylate (GMA) was added. By GLC monitoring, the GMA reaction took 21 hours. 7.5 g of maleic anhydride was then added. $^1$H NMR analysis showed that the anhydride had disappeared in 4 hours. The polymer solution had excess chlorobenzene removed in a Rotovapor unit, was formulated and solvent cast. In formulating this photocurable composition and those illustrated in the Examples below, the following amounts of components were used:

| | |
|---|---|
| carboxylated copolymer modified as decribed above | 20 g |
| hexane diol dimethacrylate | 1 g |
| polypropylene glycol methacrylate | 1 g |
| diethylene glycol diemthacrylate | 1 g |
| photoinitiator (Irgacure 651) | 0.2 g |

The film was washable in a dilute aqueous surfactant solution.

EXAMPLE 2

Solid Copolymer 20 g of a carboxylated butadiene polymer having a Mooney viscosity of 30±7.5 and carboxylic acid ephr of 0.3 (from Zeon Chemicals, formerly the Elastomers Division of B. F. Goodrich ) was dissolved in 100 g of chlorobenzene and 100 g of methyl ethyl ketone (MEK) in a 500 ml resin kettle fitted with an overhead stirrer, thermometer and a heating mantle connected to a temperature regulator. The polymer solution was heated to 60° C. and 0.3 g Geltrol, 0.3 g decane and 4 drops of nitrobenzene were added. On heating the reaction temperature of 75° C., 0.43 g of glycidyl methacrylate (GMA) and 0.3 g 1,8 diazabicyclo[5.4.0]undec-7-ene were dissolved in chlorobenzene/MEK and added to the resin kettle. According to the GLC analysis, 95% of the GMA reacted in 38 hours. Subsequently, 0.29 g of maleic anhydride was introduced and allowed to react for 2 hours. After evaporating excess solvent, the polymer solution was formulated as described in Example 1 and solvent-cast. The film was washable in a weak aqueous $Na_2CO_3$ solution and the cured plate had good mechanical properties.

EXAMPLE 3

Solid Copolymer

The following reaction was carried out in a 3 liter resin kettle equipped with a mechanical stirrer, a condenser, a thermowatch and a heating mantle. A polymer solution was prepared by dissolving 400 grams of a carboxylated polybutadiene copolymer (having a Mooney viscosity of 29 and an acid content of 0.252 ephr) in a solvent mixture of 900 ml toluene and 300 ml n-butanol by heating at 60° C. until a homogeneous mixture was obtained. The temperature of the polymer solution was then raised to 100° C. at which time a mixture of 9.6 grams decane, 2.0 grams of nitrobenzene, 5.6 grams of Geltrol, 4.0 grams of diazabicyclo [5.4.0] undec-7-ene and 7.1 grams (0.05 equivalents) of glycidyl methacrylate was added. After thorough mixing for 5-15 minutes, an aliquot sample of the reaction mixture was removed, dissolved in methanol and the extract was analyzed by GLC to determine the initial ratio of glycidyl methacrylate to decane present. Vigorous mixing of the reaction mixture at 100° C. was then allowed to continue for 30 more hours, after which it was determined that more than 95% of the reaction was complete.

EXAMPLE 4

A photocurable composition was prepared by mixing 100 parts of the adducted polymer solution prepared as described in Example 3 above, 1.75 parts of lauryl methacrylate, 0.025 parts Tinuvin 328 (antioxidant) from Ciba-Geigy, 0.074 parts Irganox 1010 and 0.156 parts Irgacure 651. The mixture was then coated onto a polymeric polyester substrate by a lab belt coater to give layers or surfaces of about 40–60 mils thick after it was solvent cast and dried. The dried coatings resulted in dry, non-tacky solid films. The plates were then exposed in an image-wise fashion to UV radiation through a negative and were developed by washing in a surfactant solution at 60° C. to remove the uncured or unexposed polymer. The surfactant solution was an aqueous solution containing 2% of an amphoteric surfactant Cycloteric 1398 (from Alcolac) and 2% of a cationic surfactant such as Triton RW-150 (from Rohm and Haas). The resulting plates gave a sharp image 15%, a Shore A hardness of 47 and demonstrated water swell resistance (less than 3%) which is suitable for water-based ink printings.

What is claimed is:

1. A photopolymerizable composition comprising a polymer having the structure:

$$(P) (Y) (Y_1) (Y_2)$$

wherein P is a polymerization product of (i) butadiene, isoprene or an acrylonitrile-butadiene copolymer and (ii) a hydrophilic monomer which is an acid containing monomer that can be copolymerized with the elastomeric monomer, and wherein P is either a solid having a Mooney viscosity of about 20 to 60 or a solid made from a liquid having a molecular weight of about 5,000 to 30,000 which has been chain extended to become solid and which has an acid content of about 0.14–0.5 ephr, Y represents at least one pendent carboxyl group and optionally one or more terminal carboxyl group; $Y_1$ is a terminal or pendent structure which contains a free photosensitive vinyl group and is present in such amounts that there are at least about 0.001 ephr $Y_1$ groups and $Y_2$ is a terminal or pendent structure containing a free photosensitive vinyl group and a free carboxyl group:

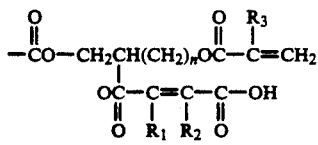

wherein $R_1$ and $R_2$ are individually a member of the group consisting of hydrogen, halogen, carboxyl, linear or cyclic alkyl containing 1–20 carbon atoms, aryl, alkaryl and aralkyl containing 6–20 carbon atoms; $R_3$ is hydrogen or methyl; and n is 1 to 6.

2. A photocurable composition according to claim 1 wherein $Y_1$ has the following structure:

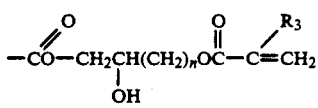

wherein $R_3$ is hydrogen or methyl and n is 1 to 6.

3. A photocurable composition according to claim 2 wherein $Y_2$ has the following structure:

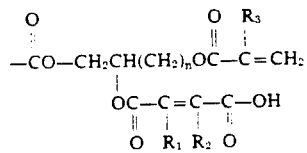

wherein $R_1$ and $R_2$ are individually a member of the group consisting of hydrogen, halogen, carboxyl, linear or cyclic alkyl containing 1–20 carbon atoms, aryl, alkaryl and aralkyl containing 6–20 carbon atoms.

4. A photocurable composition according to claim 3 wherein $Y_2$ is a maleation product from $Y_1$ in which substantially all of $Y_1$ has been maleated.

5. A photocurable composition according to claim 1 wherein P is prepared from a chain extended liquid copolymer of (i) butadiene and (ii) methacrylic acid.

6. A photocurable composition according to claim 1 wherein $R_1$ and $R_2$ are each hydrogen, $R_3$ is methyl and n is 1.

7. A photocurable composition according to claim 3 wherein $R_1$ and $R_2$ are each hydrogen, $R_3$ is methyl and n is 1.

8. A photocurable composition according to claim 2 wherein $R_3$ is methyl and n is 1.

9. A photocurable composition according to claim 1 further comprising by weight of photocurable composition up to 15% reactive monomer of the formula

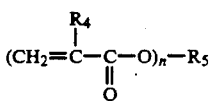

wherein $R_4$ is hydrogen or methyl, and $R_5$ is an organic moiety having the valence of n wherein n is 1 or more.

10. A photocurable composition according to claim 3 further comprising by weight of photocurable composition up to 15% reactive monomer of the formula

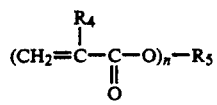

wherein $R_4$ is hydrogen or methyl, and $R_5$ is an organic moiety having the valence of n wherein n is 1 or more.

11. A photocurable composition according to claim 10 further comprising a photoinitiator.

12. A flexible photosensitive article comprising a substrate and a solid photopolymerizable layer thereon, said layer comprising $$(P)\ (Y)\ (Y_1)\ (Y_2)$$

wherein P is a polymerization product of (i) butadiene, isoprene or an acrylonitrile-butadiene copolymer and (ii) a hydrophilic monomer which is an acid containing monomer that can be copolymerized with the elastomeric monomer, and wherein P is either a solid having a Mooney viscosity of about 20 to 60 or a solid made from a liquid having a molecular weight of about 5,000 to 30,000 which has been chain extended to become solid and which has an acid content of about 0.14–0.5 ephr, Y represents at least one pendent carboxyl group and optionally one or more terminal carboxyl groups; $Y_1$ is a terminal or pendent structure which contains a free photosensitive vinyl group and is present in such amounts that there are at least about 0.001 ephr $Y_1$ groups and $Y_2$ is a terminal or pendent structure containing a free photosensitive vinyl group and a free carboxyl group:

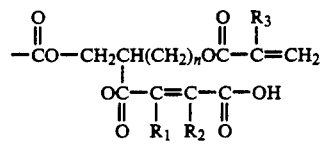

wherein $R_1$ and $R_2$ are individually a member of the group consisting of hydrogen, halogen, carboxyl, linear or cyclic alkyl containing 1–20 carbon atoms, aryl, alkaryl and aralkyl containing 6–20 carbon atoms; $R_3$ is hydrogen or methyl; and n is 1 to 6.

13. An article according to claim 12 wherein $Y_1$ has the following structure:

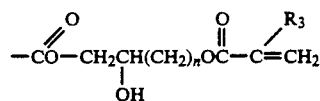

wherein $R_3$ is hydrogen or methyl and n is 1 to 6.

14. An article according to claim 13 wherein $Y_2$ has the following structure:

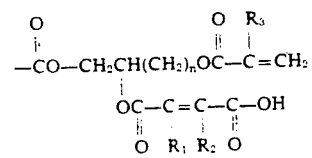

wherein $R_1$ and $R_2$ are individually a member of the group consisting of hydrogen, halogen, carboxyl, linear or cyclic alkyl containing 1-20 carbon atoms, aryl, alkaryl and aralkyl containing 6-20 carbon atoms.

15. An article according to claim 14 wherein $Y_2$ is a maleation product from $Y_1$ in which substantially all of $Y_2$ has been maleated.

16. An article according to claim 12 wherein P is a liquid copolymer of (i) butadiene and (ii) methacrylic acid, said copolymer having been chain extended to a solid.

17. An article according to claim 12, wherein $R_1$ and $R_2$ are each hydrogen.

18. An article according to claim 14 wherein $R_1$ and $R_2$ are each hydrogen, $R_3$ is methyl and n is 1.

19. An article according to claim 13, wherein $R_3$ is methyl and n is 1.

20. An article according to claim 12, wherein said layer further comprises a reactive monomer of the formula

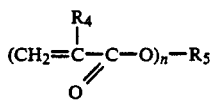

wherein $R_4$ is hydrogen or methyl, and $R_5$ is an organic moiety having the valence of n wherein n is 1 or more.

21. An article according to claim 14, wherein said layer further comprises a reactive monomer of the formula

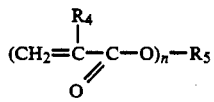

wherein $R_4$ is hydrogen or methyl, and $R_5$ is an organic moiety having the valence of n wherein n is 1 or more.

22. An article according to claim 21 wherein said layer further comprises a photoinitiator.

23. The composition of claim 1 wherein there are about 0.001–0.150 ephr $Y_1$ groups.

* * * * *

UNITED STATES PATENT AND TRADEMARK OFFICE
CERTIFICATE OF CORRECTION

PATENT NO. : 5,268,257
DATED : December 7, 1993
INVENTOR(S) : Srinivas K. Mirle and Arthur L. Berrier It is certified that error appears in the above-indentified patent and that said Letters Patent is hereby corrected as shown below:

Column 10, line 64, delete "0.14" and insert --0.1--.
Column 12, line 26, delete "0.14" and insert --0.1--.
Column 13, line 7, delete "Y$_2$" and insert --Y$_1$--.

Signed and Sealed this

Tenth Day of May, 1994

Attest:

BRUCE LEHMAN

Attesting Officer          Commissioner of Patents and Trademarks